(12) United States Patent
Koshikawa et al.

(10) Patent No.: US 8,860,076 B2
(45) Date of Patent: Oct. 14, 2014

(54) OPTICAL SEMICONDUCTOR SEALING CURABLE COMPOSITION AND OPTICAL SEMICONDUCTOR APPARATUS USING THIS

(75) Inventors: Hidenori Koshikawa, Annaka (JP); Mikio Shiono, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 24 days.

(21) Appl. No.: 13/589,364

(22) Filed: Aug. 20, 2012

(65) Prior Publication Data

US 2013/0082300 A1   Apr. 4, 2013

(30) Foreign Application Priority Data

Oct. 4, 2011   (JP) .................. 2011-219927

(51) Int. Cl.
*H01L 33/00* (2010.01)
*H01L 33/56* (2010.01)
*C08L 83/04* (2006.01)
*C08G 77/12* (2006.01)

(52) U.S. Cl.
CPC ............ *C08L 83/04* (2013.01); *H01L 33/56* (2013.01); *H01L 2224/45144* (2013.01); *H01L 2224/48257* (2013.01); *H01L 2224/48091* (2013.01); *H01L 2224/48247* (2013.01); *H01L 2224/49107* (2013.01); *H01L 2224/45124* (2013.01); *C08G 77/12* (2013.01)
USPC .................................. 257/100; 257/E33.059

(58) Field of Classification Search
USPC ........................................... 257/100, E33.059
See application file for complete search history.

(56) References Cited

U.S. PATENT DOCUMENTS

| | | | |
|---|---|---|---|
| 5,656,711 A | 8/1997 | Fukuda et al. | |
| 5,665,846 A | 9/1997 | Sato et al. | |
| 2002/0061969 A1 | 5/2002 | Shiono et al. | |

FOREIGN PATENT DOCUMENTS

| | | |
|---|---|---|
| EP | 0 765 916 A2 | 4/1997 |
| JP | B2-2990646 | 12/1999 |
| JP | B2-3239717 | 12/2001 |
| JP | A-2002-105319 | 4/2002 |
| JP | B2-3562578 | 9/2004 |

OTHER PUBLICATIONS

Nov. 14, 2012 Search Report issued in European Patent Application No. EP 12 00 6523.
Notification of Reasons for Refusal dated Apr. 8, 2014 from Japanese Patent Application No. 2011-219927 (with partial English-language translation).

*Primary Examiner* — Amar Movva
(74) *Attorney, Agent, or Firm* — Oliff PLC

(57) ABSTRACT

There are provided an optical semiconductor sealing curable composition that provides a cured material having excellent transparency, and an optical semiconductor apparatus having an optical semiconductor device sealed using the cured material obtained by curing the optical semiconductor sealing curable composition. There is provided an optical semiconductor sealing curable composition containing: (A) a linear polyfluoro compound; (B) cyclic organosiloxane having an SiH group and a fluorine-containing organic group; (C) a platinum group metal catalyst; (D) cyclic organosiloxane having an SiH group, fluorine-containing organic group, and an epoxy group; and (E) cyclic organosiloxane having an SiH group, a fluorine-containing organic group, and a cyclic carboxylic acid anhydride residue.

4 Claims, 1 Drawing Sheet

OPTICAL SEMICONDUCTOR SEALING CURABLE COMPOSITION AND OPTICAL SEMICONDUCTOR APPARATUS USING THIS

BACKGROUND OF THE INVENTION

1. Field of the Invention

The present invention relates to an optical semiconductor sealing curable composition and an optical semiconductor apparatus using this.

2. Description of the Related Art

There has been suggested obtaining an excellent cured material having well-balanced properties such as heat resistance, chemical resistance, solvent resistance, mold releasability, water-repellent properties, oil-repellent properties, a low-temperature properties, and others from a composition consisting of a linear fluoropolyether compound which has at least two alkenyl groups per molecule and a perfluoropolyether structure in a main chain, a fluorine-containing organohydrogen siloxane having two or more hydrogen atoms directly bonded to a silicon atom per molecule, and a platinum group compound (Japanese Patent No. 2990646).

Further, there has been suggested a composition which has self-adhesiveness with respect to a metal or a plastic base material by adding organopolysiloxane having a hydrosilyl group, an epoxy group, and/or a trialkoxysilyl group to the above-described composition (Japanese Patent No. 3239717).

Furthermore, there has been suggested a composition having improved adhesiveness with respect to various base materials, especially, a polyphenylene sulphide resin (PPS), a polyamide resin, and a polyimide resin by adding organosiloxane having a cyclic carboxylic acid anhydride residue to the above-described composition (Japanese Patent No. 3562578).

However, when a cured material obtained by curing each of such compositions actually prepared according to these conventional technologies is used as a sealing medium of a light-emitting diode (which will be referred to as an "LED" hereinafter unless if not otherwise specified), there occurs a problem that this cured material becomes turbid and transparency is degraded. When the transparency of the sealing medium is degraded, efficiency of enabling taking light emitted from the LED to the outside (which will be referred to as "light taking-out efficiency" hereinafter) is lowered, whereby brightness of an optical semiconductor apparatus using the LED as a light source is also decreased.

SUMMARY OF THE INVENTION

In view of the above-described problems, it is an object of the present invention to provide an optical semiconductor sealing curable composition which provides a cured material having excellent transparency and an optical semiconductor apparatus having an optical semiconductor device sealed by a cured material obtained by curing the optical semiconductor sealing curable composition.

To achieve this aim, according to the present invention, there is provided an optical semiconductor sealing curable composition, wherein the optical semiconductor sealing curable composition contains:

(A) 100 parts by mass of a linear polyfluoro compound represented by the following general formula (1),

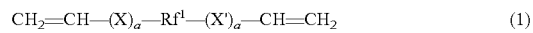

wherein X represents a group represented by any one of $-CH_2-$, $-CH_2O-$, $-CH_2OCH_2-$, and $-Y-NR^1-CO-$ (Y represents $-CH_2-$ or an o, m, or p-dimethylsilylphenylene group represented by the following structural formula (2),

and $R^1$ represents a hydrogen atom or an unsubstituted or substituted monovalent hydrocarbon group), X' represents a group represented by any one of $-CH_2-$, $-OCH_2-$, $-CH_2OCH_2-$, and $-CO-NR^1-Y'-$ (Y' represents $-CH_2-$ or an o, m, or p-dimethylsilylphenylene group represented by the following structural formula (3), and $R^1$ represents the same group as above, and

a represents independently 0 or 1, $Rf^1$ represents a divalent perfluoropolyether group represented by the following general formula (4) or (5),

wherein each of p and q represents an integer of 1 to 150, and an average of sums of p and q is 2 to 300, further, r represents an integer of 0 to 6, and t represents 2 or 3,

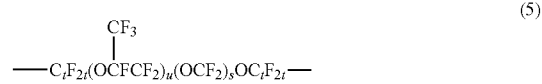

wherein u represents an integer of 1 to 300, s represents an integer of 1 to 80, and t represents the same as above;

(B) cyclic organopolysiloxane which is represented by the following general formula (6) and has a hydrogen atom directly liked with a silicon atom and a monovalent perfluoroalkyl group or a monovalent perfluorooxyalkyl group bonded to the silicon atom through a divalent hydrocarbon group which is allowed to contain an oxygen atom or a nitrogen atom per molecule, and whose amount allows the hydrogen atom directly bonded to the silicon atom to be 0.5 to 2.0 mole with respect to 1 mole of the alkenyl group in the component (A),

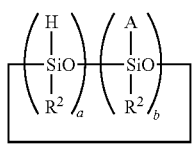

(6)

wherein a represents an integer of 3 to 6, b represents an integer of 1 to 4, a+b represents an integer of 4 to 10, $R^2$ represents a substituted or unsubstituted monovalent hydrocarbon group, and A represents a monovalent perfluoroalkyl group or a monovalent perfluorooxyalkyl group bonded to a silicon atom through a divalent hydrocarbon group that is allowed to contain an oxygen atom or a nitrogen atom;

(C) 0.1 to 500 ppm of a platinum group metal catalyst when converted into a platinum group metal atom;

(D) 0.1 to 10.0 parts by mass of cyclic organopolysiloxane which is represented by the following general formula (7) and has a hydrogen atom directly bonded to a silicon atom, a monovalent perfluoroalkyl group or a monovalent perfluorooxyalkyl group bonded to a silicon atom through a divalent hydrocarbon group that is allowed to contain an oxygen atom or a nitrogen atom, and an epoxy group bonded to a silicon atom through a divalent hydrocarbon group that is allowed to contain an oxygen atom per molecule,

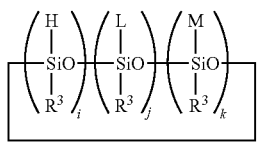

(7)

wherein i represents an integer of 1 to 6, j represents an integer of 1 to 4, k represents an integer of 1 to 4, i+j+k represents an integer of 4 to 10, $R^3$ represents a substituted or unsubstituted monovalent hydrocarbon group, L represents a monovalent perfluoroalkyl group or a monovalent perfluorooxyalkyl group bonded to a silicon atom through a divalent hydrocarbon group that is allowed to contain an oxygen atom or a nitrogen atom, and M represents an epoxy atom bonded to a silicon atom through a divalent hydrocarbon group that is allowed to contain an oxygen atom; and (E) 0.01 to 5.0 parts by mass of cyclic organopolysiloxane which is represented by the following general formula (8) and has a hydrogen atom directly bonded to a silicon atom, a monovalent perfluoroalkyl group or a monovalent perfluorooxyalkyl group bonded to a silicon atom through a divalent hydrocarbon group that is allowed to contain an oxygen atom or a nitrogen atom, and a cyclic carboxylic acid anhydride residue bonded to a silicon atom through a divalent hydrocarbon group per molecule,

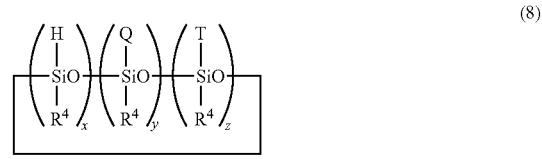

(8)

wherein x represents an integer of 1 to 6, y represents an integer of 1 to 4, z represents an integer of 1 to 4, x+y+z represents an integer of 4 to 10, $R^4$ represents a substituted or unsubstituted monovalent hydrocarbon group, Q represents a monovalent perfluoroalkyl group or a monovalent perfluorooxyalkyl group bonded to a silicon atom through a divalent hydrocarbon group that is allowed to contain an oxygen atom or a nitrogen atom, and T is a cyclic carboxylic acid anhydride residue bonded to a silicon atom through a divalent hydrocarbon group.

Such an optical semiconductor sealing curable composition as addition-cure type fluoroether based curable composition containing all of the components (A) to (E) exercise the excellent adhesiveness with respect to various base materials, especially polyphthalic amide (PPA) and provides a cured material having the excellent transparency. Therefore, the cured material of the optical semiconductor sealing curable composition is suitable for a sealing medium for an optical semiconductor device, especially a sealing medium used for protecting an LED.

Further, in the optical semiconductor sealing curable composition, a transmittance for linear light having a wavelength of 450 nm in a cured material having a thickness of 2 mm after curing is preferably not lower than 80%.

As described above, when the transmittance for the linear light having the wavelength of 450 nm in the cured material having the thickness of 2 mm after curing is not lower than 80%, the light taking-out efficiency of the optical semiconductor apparatus having the optical semiconductor device sealed by the cured material obtained by curing the optical semiconductor sealing curable composition according to the present invention is not decreased, which is preferable.

Furthermore, in the optical semiconductor sealing curable composition, a refractive index of the cured material after curing at 25° C. and 589 nm (a D line of sodium) is preferably 1.30 to 1.39.

When the refractive index falls within this range, the light taking-out efficiency of the optical semiconductor apparatus having the optical semiconductor device sealed by the cured material obtained by curing the composition according to the present invention is not decreased by design of the optical semiconductor apparatus, which is preferable.

Moreover, content of the alkenyl group in the linear polyfluoro compound in the component (A) is preferably 0.005 to 0.100 mole/100 g.

As described above, when the content of the alkenyl group in the component (A) is less than 0.005 mole/100 g, a degree of cross-linkage becomes insufficient, and a curing defect may possibly occur, which is not preferable. When the content of the alkenyl group exceeds 0.100 mole/100 g, mechanical characteristics of this cured material as a rubber elastic body may be possibly degraded.

Additionally, the monovalent perfluoroalkyl group or the monovalent perfluorooxyalkyl group included in each cyclic organopolysiloxane in the component (B), the component (D), and the component (E) is preferably represented by the following general formula (9) or general formula (10), $$C_fF_{2f+1}— \tag{9}$$

wherein f represents an integer of 1 to 10,

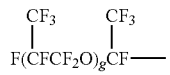

wherein g represents an integer of 1 to 10.

As described above, it is preferable for the monovalent perfluoroalkyl group or the monovalent perfluorooxyalkyl group to be represented by general formula (9) or general formula (10).

Further, the present invention provides an optical semiconductor apparatus comprising: an optical semiconductor device; and a cured material which is obtained by curing an optical semiconductor sealing curable composition configured to seal the optical semiconductor device.

Since the optical semiconductor sealing curable composition according to the present invention can provide the cured material having the excellent transparency, the optical semiconductor apparatus having the optical semiconductor device sealed by this cured material has the excellent light taking-out efficiency (efficiency of enabling taking light emitted from the optical semiconductor device to the outside).

Furthermore, the optical semiconductor device is preferably a light-emitting diode.

As described above, the cured material of the optical semiconductor sealing curable composition according to the present invention is suitable as the sealing medium configured to protect a light-emitting diode in particular.

According to the optical semiconductor sealing curable composition of the present invention, combining the components (A) to (E) enables the cured material to have the excellent transparency, whereby the optical semiconductor apparatus having the sealed optical semiconductor device has the excellent light taking-out efficiency (the efficiency of enabling taking light emitted from the optical semiconductor device to the outside). Moreover, since the optical semiconductor sealing curable composition exercises the excellent adhesiveness with respect to various base materials, especially a polyphthalate amide (PPA), it is suitable as the sealing medium configured to protect an LED.

DETAILED DESCRIPTION OF THE PREFERRED EMBODIMENT

Figure 1:
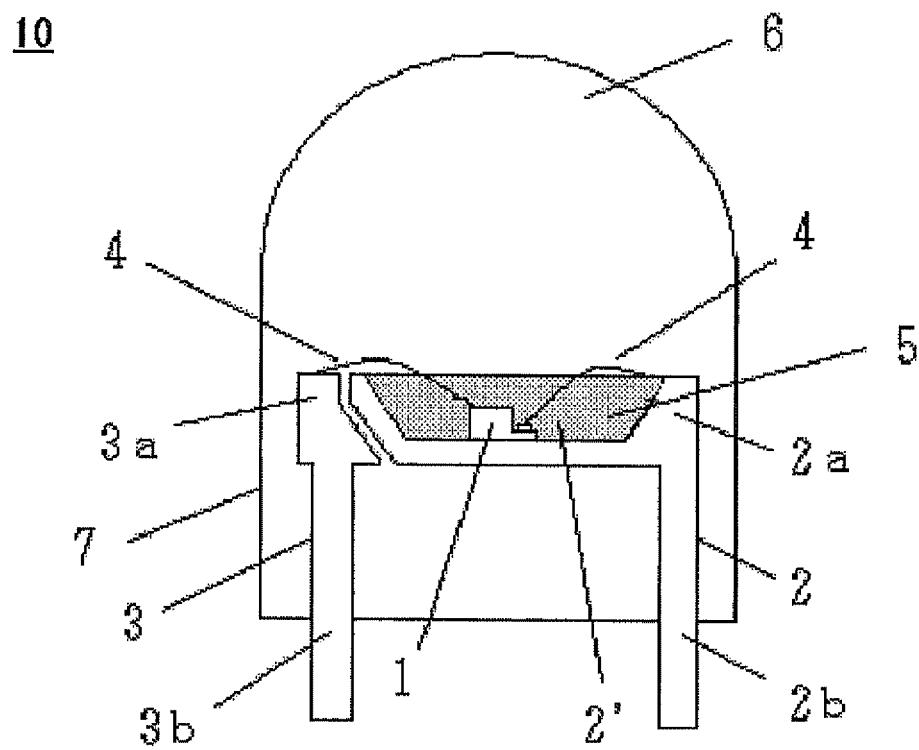
FIG. 1 is a schematic cross-sectional view showing an example of an optical semiconductor apparatus according to the present invention.

The present invention will now be described hereinafter in more detail.

As described above, there have been demanded an optical semiconductor sealing curable composition which provides a cured material having excellent transparency and has excellent adhesiveness with respect to various base materials, especially PPA, and an optical semiconductor apparatus having an optical semiconductor device sealed by the cured material obtained by curing the composition.

To achieve the above-described object, the present inventors devoted themselves to conduct examinations, and they thereby found out that a composition containing all of the following components (A) to (E) can turn to an optical semiconductor sealing curable composition which provides a cured material having excellent transparency as an effect obtained by combining the following components (A) to (E), and brought the present invention to completion. The present invention will now be described hereinafter in detail.

[Component (A)]

The component (A) according to the present invention is a linear polyfluoro compound represented by the following general formula (1),

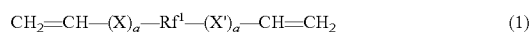

wherein X represents a group represented by any one of —CH$_2$—, —CH$_2$O—, —CH$_2$OCH$_2$—, and —Y—NR$^1$—CO— (Y represents —CH$_2$— or an o, m, or p-dimethylsilylphenylene group represented by the following structural formula (2),

R$^1$ represents a hydrogen atom or an unsubstituted or substituted monovalent hydrocarbon group), X' represents a group represented by any one of —CH$_2$—, —OCH$_2$—, —CH$_2$OCH$_2$—, and —CO—NR$^1$—Y'— (Y' represents —CH$_2$— or an o, m, or p-dimethylsilylphenylene group represented by the following structural formula (3), and R$^1$ represents the same group as above, and

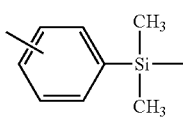

(3)

a represents independently 0 or 1, $Rf^1$ represents a divalent perfluoropolyether group represented by the following general formula (4) or (5),

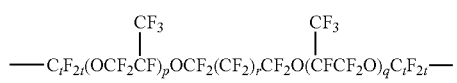

(4)

wherein each of p and q represents an integer of 1 to 150, and an average of sums of p and q is 2 to 300, further, r represents an integer of 0 to 6, and t represents 2 or 3,

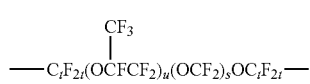

(5)

wherein u represents an integer of 1 to 300, s represents an integer of 1 to 80, and t represents the same as above.

Here, when $R^1$ is other than a hydrogen atom, a monovalent hydrocarbon group having carbon atom numbers 1 to 12, especially 1 to 10 is preferable, and there are specifically an alkyl group such as a methyl group, en ethyl group, a propyl group, a butyl group, a hexyl group, a cyclohexyl group, or an octyl group; an aryl group such as a phenyl group or a tolyl group; an aralkyl group such as a benzyl group or a phenylethyl group, and a substituted monovalent hydrocarbon group obtained by substituting some or all of hydrogen atoms in each of such groups by a halogen atom of fluorine and the like.

$Rf^1$ in general formula (1) represents a divalent perfluoropolyether structure represented by the following general formula (4) or (5),

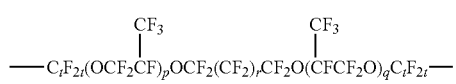

(4)

wherein each of p and q represents an integer of 1 to 150 or preferably an integer of 1 to 100, and an average of sums of p and q represents 2 to 300, preferably 2 to 200, or more preferably 10 to 150. r represents an integer of 0 to 6, and t is 2 or 3,

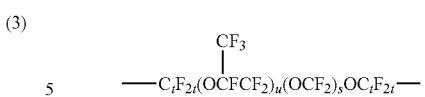

(5)

wherein u represents an integer of 1 to 300, preferably an integer of 1 to 200, or more preferably an integer of 10 to 150, s represents an integer of 1 to 80 or preferably an integer of 1 to 50, and t represents the same as above.

As referred examples of the $Rf^1$ group, there are ones represented by the following formula (i) to (iii). More preferably, there is a divalent group having a structure represented by formula (i),

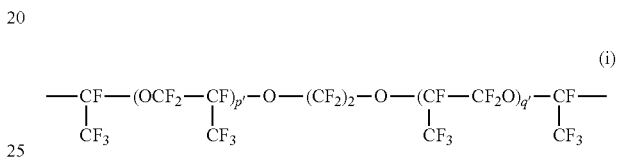

(i)

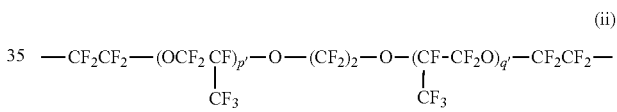

(ii)

wherein each of p' and q' represents an integer of 1 to 150 or preferably an integer of 1 to 100, and p'+q' (average) is 2 to 300, preferably 2 to 200, or more preferably 10 to 150,

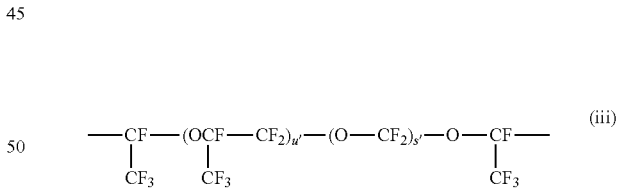

(iii)

wherein u' represents an integer of 1 to 300, preferably an integer of 1 to 200, or more preferably an integer of 10 to 150, and s' represents an integer of 1 to 80, preferably an integer of 1 to 50, or more preferably an integer of 1 to 30.

As a preferred example of the component (A), there is a compound represented by the following general formula (11),

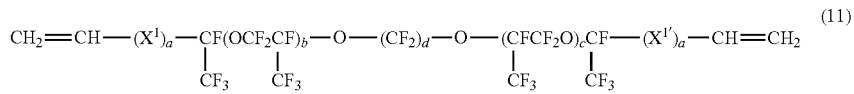

wherein $X^1$ represents a group represented as —$CH_2$—, —$CH_2O$—, —$CH_2OCH_2$—, or —Y—$NR^{1'}$—CO— (Y represents —$CH_2$— or an o, m, or p-dimethylsilylphenylene group represented by the following structural formula (2), and $R^{1'}$ represents a hydrogen atom, a methyl group, a phenyl group, or an allyl group,

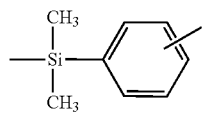

wherein $X^{1'}$ represents a group represented as —$CH_2$—, —$OCH_2$—, —$CH_2OCH_2$—, or —CO—$NR^{1'}$—Y"— (Y' represents —$CH_2$— or an o, m, or p-dimethylsilylphenylene group represented by —$CH_2$— or the following structural formula (3), and $R^{1'}$ represents the same as above,

wherein a represents independently 0 or 1, d represents an integer of 2 to 6, each of b and c represents an integer of 0 to 200, preferably an integer of 1 to 150, or more preferably an integer of 1 to 100, and b+c (average) is 0 to 300, preferably 2 to 200, or more preferably 10 to 150.

Specific examples of the linear polyfluoro compound represented by general formula (11) are as follows,

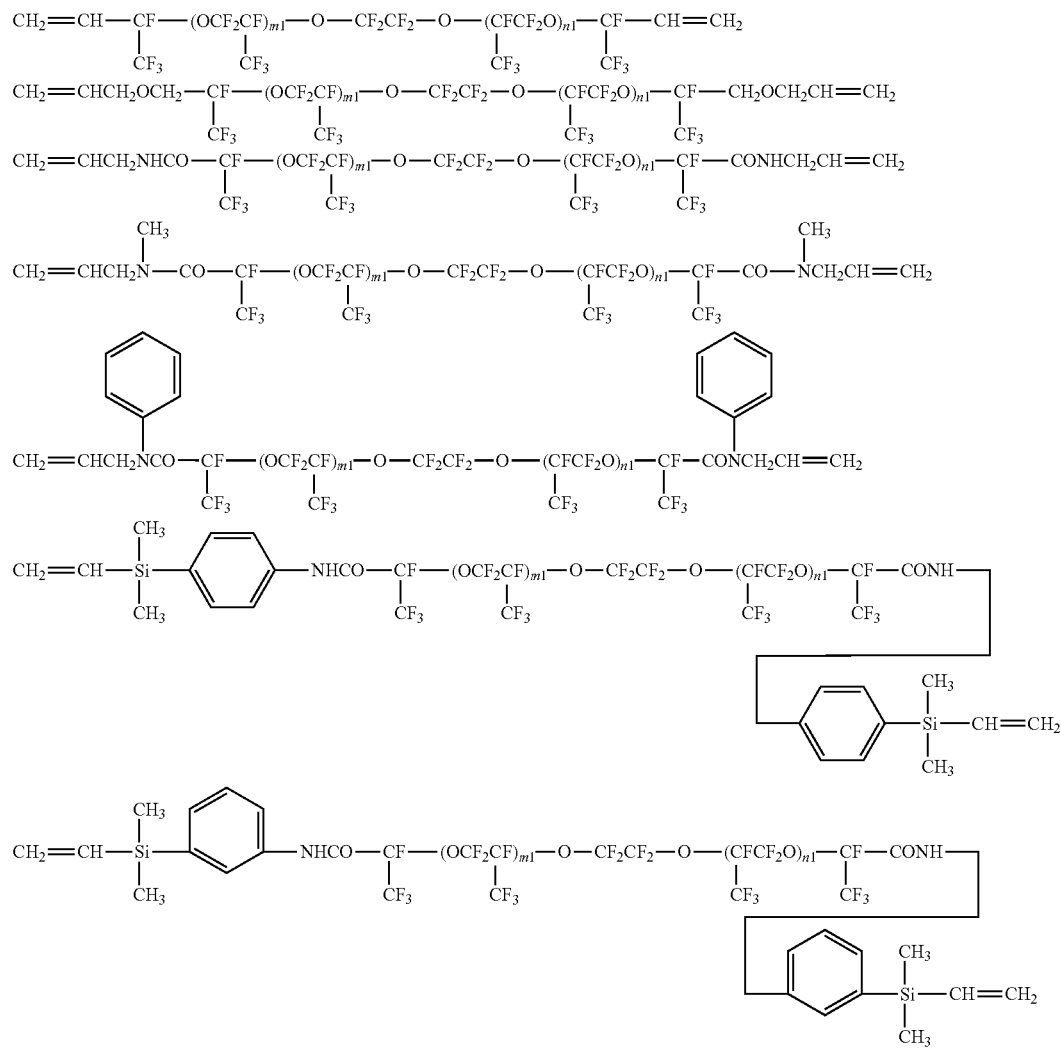

-continued

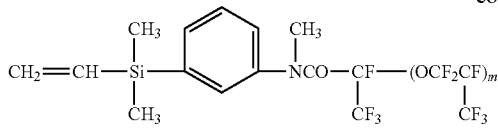 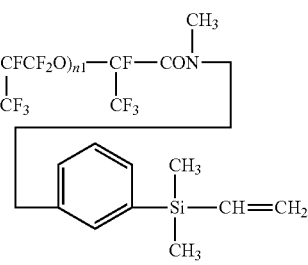

wherein each of m1 and n1 represents an integer of 1 to 150 or preferably an integer of 1 to 100, and m1+n1 represents an integer meeting 2 to 300 or preferably 6 to 200.

In addition, it is desirable for viscosity (23° C.) of the linear polyfluoro compound represented by general formula (1) to fall within the range of 100 to 100,000 mPa·s, preferably 500 to 50,000 mPa·s, or more preferably 1,000 to 20,000 mPa·s in viscometric measurement conforming to JIS K6249 since a cured material has appropriate physical properties when this composition is used for sealing, potting, coating, or immersion. The most appropriate viscosity can be selected within this viscosity range depending on the intended use.

The content of the alkenyl group contained in the linear polyfluoro compound represented by general formula (1) is preferably 0.005 to 0.100 mole/100 g or more preferably 0.008 to 0.050 mole/100 g. When the content of the alkenyl group contained in the linear fluoropolyether compound is not lower than 0.005 mole/100 g, a degree of cross-linkage is sufficient, and there is no possibility that a curing defect occurs, which is desirable. When the content of the alkenyl group is not greater than 0.100 mole/100 g, there is no possibility that the mechanical characteristic of this cured material as a rubber elastic body are not degraded, which is preferable.

One type of such a linear polyfluoro compound can be solely used, or two or more types of the same can be combined and used.

[Component (B)]

The component (B) is cyclic organopolysiloxane which is represented by the following Generation formula (6) and has a hydrogen atom directly bonded to a silicon atom and a monovalent perfluoroalkyl group or a monovalent perfluorooxyalkyl group bonded to a silicon atom through a divalent hydrocarbon group which may contain an oxygen atom or a nitrogen atom per molecule, and it functions as a cross-linker or a chain lengthener of the component (A).

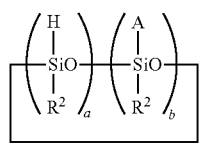 (6)

In general formula (6), a represents an integer of 3 to 6 or preferably an integer of 3 to 5, b represents an integer of 1 to 4 or preferably an integer of 1 to 3, and a+b represents an integer of 4 to 10 or preferably an integer of 4 to 8.

Further, $R^2$ represents a substituted or unsubstituted monovalent hydrocarbon group, and there is the same group as the substituted or unsubstituted monovalent hydrocarbon group of $R^1$.

Furthermore, A represents a monovalent perfluoroalkyl group or a monovalent perfluorooxyalkyl group coupled with a silicon atom through a divalent hydrocarbon group which may contain an oxygen atom or a nitrogen atom. These are groups which are introduced in terms of compatibility with the component (A), dispersibility, homogeneity after curing, and others.

As the monovalent perfluoroalkyl group or the monovalent perfluorooxyalkyl group, there are groups represented, by the following general formula (9) and (10), $$C_fF_{2f+1}— \qquad (9)$$

wherein f represents an integer of 1 to 10 or preferably 3 to 7,

 (10)

wherein g represents an integer of 1 to 10 or preferably integer of 2 to 8.

Moreover, the monovalent perfluoroalkyl group or the monovalent perfluorooxyalkyl group is bonded to a silicon atom through a divalent hydrocarbon group which may contain an oxygen atom or a nitrogen atom and, as a divalent linking group, there are an alkylene group having a carbon atom number of 2 to 12, the same group having, e.g., an ether-linked oxygen atom, amide linkage, or carbonyl linkage, and others, and there are the following groups.

—$CH_2CH_2$—;

—$CH_2CH_2CH_2$—;

—$CH_2CH_2CH_2OCH_2$—;

—$CH_2CH_2CH_2$—NH—CO—;

—$CH_2CH_2CH_2$—N(Ph)—CO— (wherein Ph represents a phenyl group);

—$CH_2CH_2CH_2$—N($CH_3$)—CO—; and

—$CH_2CH_2CH_2$—O—CO—

As such a component (B), for example, there are the following components. It is to be noted that, in the following formula, Me is a methyl group, and Ph is a phenyl group.

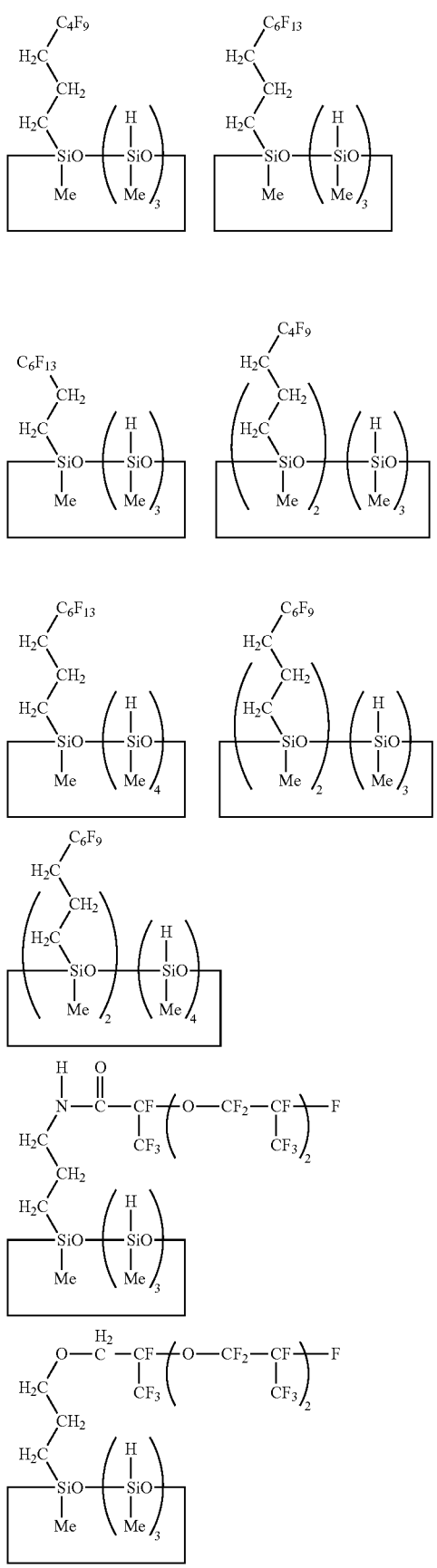
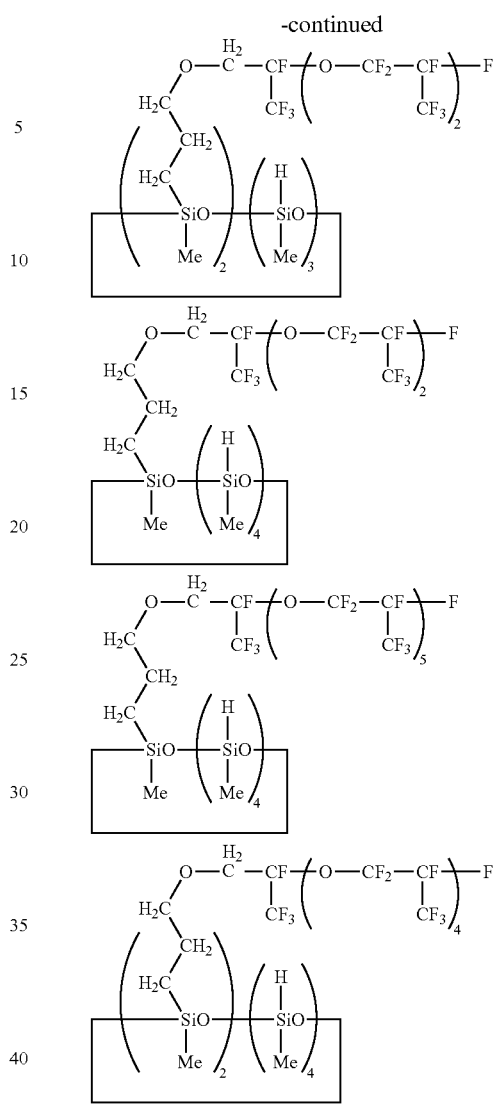

One type of the component (B) alone may be used, or two or more types of the component (B) may be used at the same time.

As a compounding amount of the component (B), an SiH group (a hydrogen atom directly bonded to a silicon atom) in the component (B) is 0.5 to 2.0 mole or preferably 0.7 to 1.5 mole with respect to 1 mole of the alkenyl group contained in the component (A). A degree of cross-linkage becomes insufficient and hence a cured material may not be obtained when the SiH group is less than 0.5 mole, and foam may be possibly formed at the time of curing when the SiH group exceeds 2.0 mole.

[Component (C)]

A platinum group metal catalyst which is the component (C) according to the present invention is a hydrosilylation reaction catalyst. The hydrosilylation reaction catalyst is a catalyst that facilitates an addition reaction of an alkenyl group contained in a composition, especially an alkenyl group in the component (A) and an SiH group contained in the composition, especially an SIR group in the component (B).

Since this hydrosilylation reaction catalyst is generally a noble metal or its compound and expensive, platinum or a platinum compound which is relatively easily available is often used.

As the platinum compounds, for example, there are a chloroplatinic acid or a complex of a chloroplatinic acid and olefin such as ethylene, a complex of an alcohol or vinylsiloxane, a metal platinum supported by silica, alumina, or carbon, and others. As platinum group metal catalysts other than platinum and its compounds, rhodium, ruthenium, iridium, and palladium based compounds are known and, for example, there are $RhCl(PPh_3)_3$, $RhCl(CO)(PPh_3)_2$, $Ru_3(CO)_{12}$, $IrCl(CO)(PPh_3)_2$, $Pd(PPh_3)_4$, and others. It is to be noted that Ph is a phenyl group in the above formula.

When using each of these catalysts, although the catalyst can be used in the form of a solid if it is a solid catalyst, in order to obtain a more homogeneous cured material, it is preferable to compatibilize a material obtained by dissolving a chloroplatinic acid or a complex with an appropriate solvent such as toluene or ethanol with respect to a linear polyfluoro compound of the component (A).

A compounding amount of the component (C) is an effective amount as a hydrosilylation reaction catalyst, and it is 0.1 to 500 ppm or preferably 0.5 to 200 ppm (converted into a mass of a platinum metal atom) with respect to the component (A), but it can be appropriately increased or decreased with respect to a desired curing rate.

[Component (D)]

The component (D) according to the present invention is a cyclic organopolysiloxane which is represented by the following general formula (7) and has: a hydrogen atom directly bonded to a silicon atom and a monovalent perfluoroalkyl group or a monovalent perfluorooxyalkyl group bonded to a silicon atom through a divalent hydrocarbon group that may contain an oxygen atom or a nitrogen atom; and an epoxy group bonded to a silicon atom through a divalent hydrocarbon group which may contain an oxygen atom per molecule, and it is an adhesion provider which provides self-adhesiveness to the composition according to the present invention.

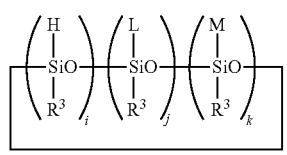

(7)

In general formula (7), i represents an integer of 1 to 6 or preferably an integer of 1 to 5, j represents an integer of 1 to 4 or preferably an integer of 1 to 3, k represents an integer of 1 to 4 or preferably an integer of 1 to 3, i+j+k represents an integer of 4 to 10 or preferably an integer of 4 to 8.

Moreover, $R^3$ represents a substituted or unsubstituted monovalent hydrocarbon group, and there is the same group as the substituted or unsubstituted monovalent hydrocarbon group of $R^1$.

Additionally, L is a monovalent perfluoroalkyl group or a monovalent perfluorooxyalkyl group bonded to a silicon atom through a divalent hydrocarbon group which may contain an oxygen atom or a nitrogen atom, and there is the same group as A described above. Each of these groups is a group that is introduced in terms of compatibility with the component (A), dispersibility, homogeneity after curing, and others.

Further, M represents an epoxy group bonded to a silicon atom through a divalent hydrocarbon group which may contain an oxygen atom and, specifically, there is the following group,

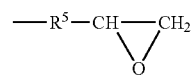

wherein $R^5$ represents a divalent hydrocarbon group having a carbon atom number of 1 to 10, especially 1 to 5, and there are specifically an alkylene group such as a methylene group, an ethylene group, a propylene group, a butylene group, a hexylene group, or an octylene group, a cycloalkylene group such as a cyclohexylene group, an oxyalkylene group such as an oxyethylene group, an oxypropylene group, or an oxybutylene group, and others.

As M, there are specifically the following groups.

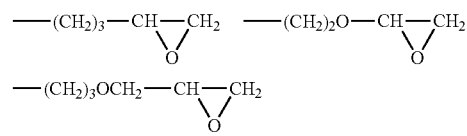

As such a component (D), for example, there are the following compounds. It is to be noted that Me represents a methyl group in the following formula.

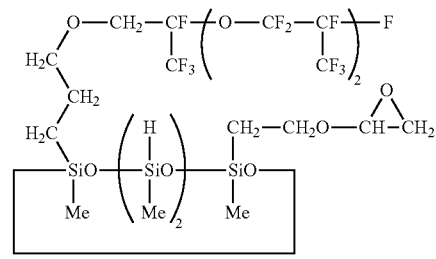

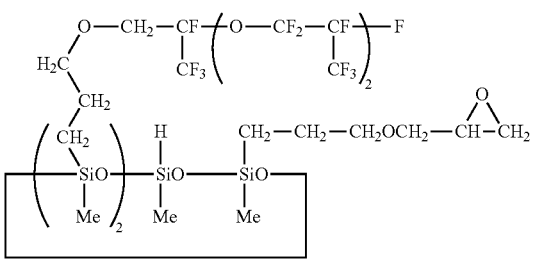

-continued

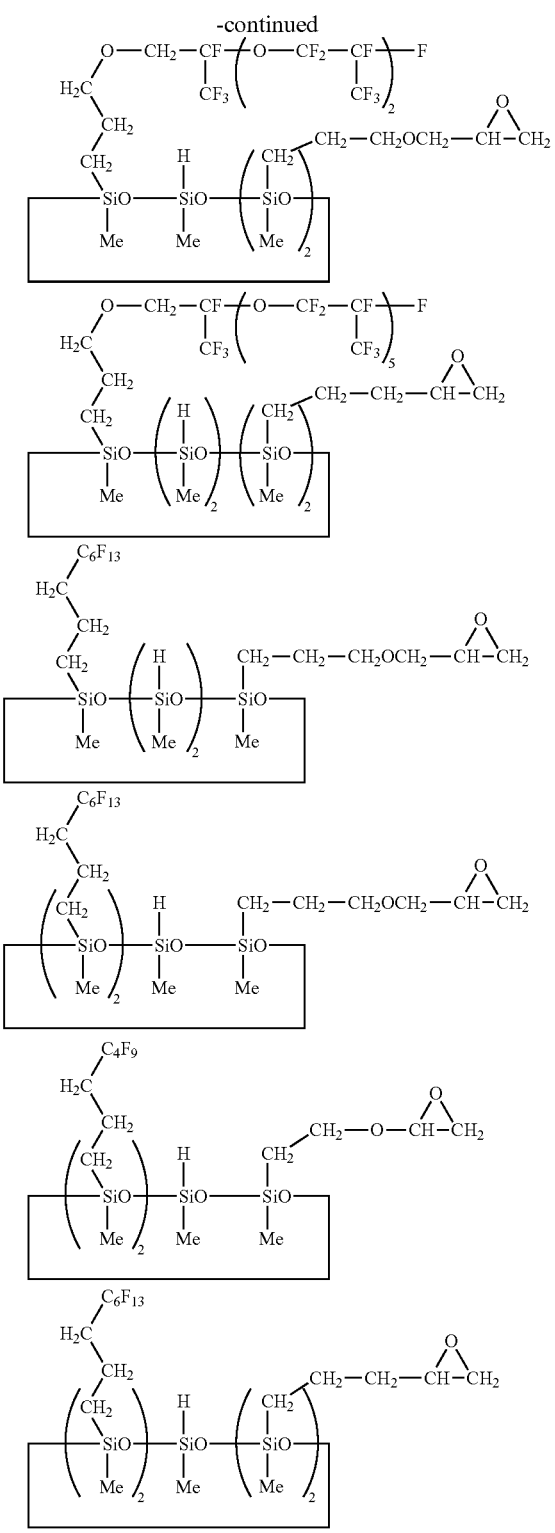

One type of the component (D) may be solely used, or two or more types of the component (D) may be used at the same time. Furthermore, an amount of the component (D) used is 0.1 to 10.0 parts by mass or preferably 0.5 to 7.0 parts by mass with respect to 100 parts by mass of the component (A). Sufficient adhesiveness cannot be obtained when this mount is less than 0.1 part by mass, or flowability of the composition becomes poor and obtained physical strength of the cured material is lowered when this amount exceeds 10.0 parts by mass.

[Component (E)]

The component (E) according to the present invention is a cyclic organopolysiloxane which is represented by the following general formula (8) and has: a hydrogen atom directly bonded to a silicon atom, a monovalent perfluoroalkyl group or a monovalent perfluorooxyalkyl group bonded to a silicon atom through a divalent hydrocarbon group that may contain an oxygen atom or a nitrogen atom; and a cyclic carboxylic acid anhydride residue bonded to a silicon atom through a divalent hydrocarbon group per molecule, and it improves adhesion providing capability of the component (D) according to the present invention and facilitates development of self-adhesiveness of the composition according to the present invention.

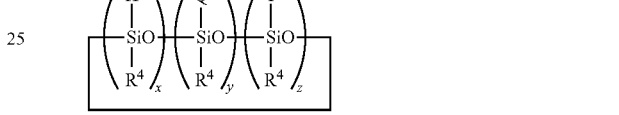

(8)

In general formula (8), x represents an integer of 1 to 6 or preferably an integer of 1 to 5, y represents an integer of 1 to 4 or an integer of 1 to 3, z represents an integer of 1 to 4 or an integer of 1 to 3, and x+y+z represents an integer of 4 to 10 or preferably an integer of 4 to 8.

Further, $R^4$ represents a substituted or unsubstituted monovalent hydrocarbon group, and there is the same group as the substituted or unsubstituted monovalent hydrocarbon group of $R^1$.

Furthermore, Q represents a monovalent perfluoroalkyl group or a monovalent perfluorooxyalkyl group bonded to a silicon atom through a divalent hydrocarbon group that may contain an oxygen atom or a nitrogen atom, and there is the same group as A described above. Each of these groups is a group that is introduced in terms of compatibility with the component (A), dispersibility, homogeneity after curing, and others.

Moreover, T represents a cyclic carboxylic acid anhydride residue bonded to a silicon atom through a divalent hydrocarbon group, and it can be exemplified as follows,

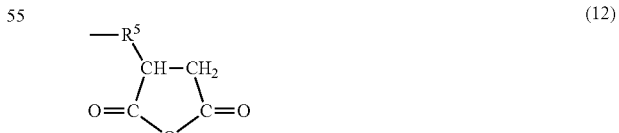

(12)

wherein $R^5$ represents an alkylene group having a carbon atom number of 2 to 12.

As such a component (E), there are the following compounds, for example. It is to be noted that Me represents a methyl group in the following formula.

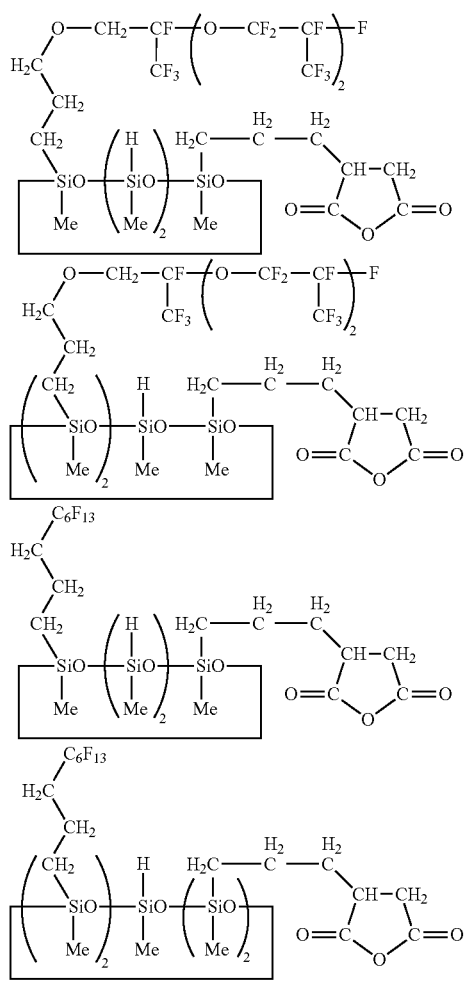

One type of the component (E) may be solely used, or two or more types of the component (E) may be used at the same time.

A compounding amount of the component (E) is 0.01 to 5.0 parts by mass or preferably 0.05 to 2.0 parts by mass with respect to 100 parts by mass of the component (A). A sufficient adhesion facilitating effect cannot be obtained when this mount is less than 0.01 part by mass, or preserving properties of the composition is degraded and obtained physical strength of the cured material is lowered when this amount exceeds 5.0 parts by mass.

[Any Other Component]

In the optical semiconductor sealing curable composition according to the present invention, to enhance its practicality, various compounding agents such as a plasticizing agent, a viscosity modifier agent, a flexibility providing agent, an inorganic filler, a reaction controlling agent, an adhesion prompter, and others can be added as required besides the components (A) to (E). A compounding amount of each of these additives is arbitrary.

As the plasticizing agent, the viscosity modifier agent, and the flexibility providing agent, a polyfluoromonoalkenyl compound represented by the following general formula (13) and/or a linear polyfluoro compound represented by the following general formula (14) and (15) can be used, $$Rf^2-(X')_a CH=CH_2 \quad (13)$$

wherein X' and a represent the same as those described in formula (1), and $Rf^2$ represents a group represented by the following general formula (16), $$F(CFCF_2O)_{f'}C_{h'}F_{2h'}-  \quad (16)$$
$$\quad\quad | $$
$$\quad CF_3$$

wherein f' represents an integer that is not smaller than 1, preferably an integer of 1 to 100, or more preferably an integer of 1 to 50, h' is 2 or 3 and smaller than each of p+q (average) concerning the $Rf^1$ group of the component (A), a sum of u and s, and a sum of b to d.

$$D-O-(CF_2CF_2CF_2O)_{c'}-D \quad (14)$$

wherein D represents a group represented as $C_{b'}F_{2b'+1}$—(b' represents 1 to 3), c' represents an integer of 1 to 200 or preferably an integer of 2 to 100 and smaller than each of p+q (average) concerning the $Rf^1$ group of the component (A), a sum of u and s, and a sum of b to d, $$D-O-(CF_2O)_{d'}(CF_2CF_2O)_{e'}-D \quad (15)$$

wherein D represents the same as above, each of d' and e' represents an integer of 1 to 200 or preferably an integer 1 to 100, and a sum of d' and e' represents smaller than each of p+q (average) concerning the $Rf^1$ group of the component (A), a sum of u and s, and a sum of b to d.

Specific examples of a polyfluoromonoalkenyl compound represented by general formula (13) are as follows (it is to be noted that m2 meets the above requirements in the following formula).

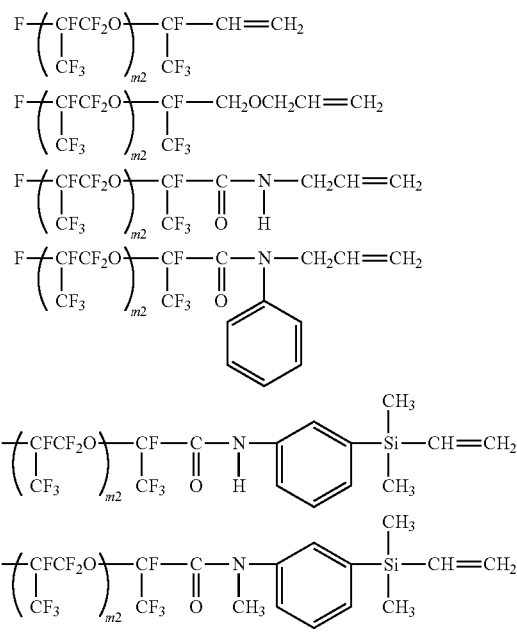

As specific examples of the linear polyfluoro compound represented by general formula (14) and (15) are as follows (it is to be noted that n3 or a sum of n3 and m3 meet the above requirements),

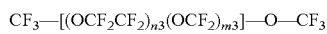

wherein m3+n3=2 to 201, m3=1 to 200, and n3=1 to 200.

Further, it is desirable for viscosity (23° C.) of the polyfluoro compound represented by each of general formula (13) to (15) to fall within the range of 5 to 100,000 mPa·s, especially 50 to 50,000 mPa·s in the same measurement as that for the component (A).

Furthermore, a compounding amount when adding the polyfluoro compound represented by each of general formula (13) to (15) is preferably 1 to 100 parts by mass or more preferably 1 to 50 parts by mass with respect to 100 parts by mass of the component (A).

As the inorganic filler, for example, it is possible to add a reinforcement or quasi-reinforcement filler such as fumed silica, colloidal silica, quartz powder, fused quartz powder, diatom earth, or calcium carbonate [it is preferable to set a compounding amount of 0.1 to 30 parts by mass, especially 1 to 20 parts by mass with respect to 100 parts by mass of the component (A)], an inorganic pigment such as titanium oxide, iron oxide, or cobalt aluminate, heat-resistant improver such as titanium oxide, iron oxide, carbon black, cerium oxide, cerium hydroxide, zinc carbonate, magnesium carbonate, or manganese carbonate, or a thermal conductivity provider such as alumina, boron nitride, silicon carbide, or metal powder having a specific surface area of 50 m$^2$/g or above (which is usually 50 to 400 m$^2$/g), especially approximately 100 to 350 m$^2$/g based on a BET method.

As examples of the control agent for the hydrosilylation reaction catalyst, there are acetylene alcohol such as 1-ethynyl-1-hydroxycyclohexane, 3-methyl-1-butyne-3-ol, 3,5-dimethyl-1-hexene-3-ol, 3-methyl-1-pentene-3-ol, or phenylbutynol, a reactant of chlorosilane having the same monovalent perfluoroalkyl group or monovalent perfluorooxyalkyl group as A described above and acetylene alcohol, 3-methyl-3-pentene-1-yne, 3,5-dimethyl-3-hexene-1-yne, triallylisocyanurate, polyvinylsiloxane, an organic phosphorous compound, and others, and adding such control agents enables adequately maintaining curing reactivity and maintenance stability.

A manufacturing method of the optical semiconductor sealing curable composition according to the present invention is not restricted in particular, and manufacture is enabled by kneading the components (A) to (E) and any other arbitrary components. At this moment, a mixing apparatus such as a planetary mixer, a Ross mixer, or a Hobart mixer, or a kneading apparatus such as a kneader or a three-roll mill can be used as required.

In regard to the configuration of the optical semiconductor sealing curable composition according to the present invention, this composition may be configured as a so-called one-liquid type that all of the components (A) to (E) and any other arbitrary components are treated as one composition or a two-liquid type that both types of components are mixed at the time of use.

The optical semiconductor sealing curable composition according to the present invention is cured and has high transparency when heated, it excellently adheres to a package material such as polyphthalic amide (PPA) or a liquid crystal polymer (LCP) or a metal substrate, and hence this composition is useful as a sealing medium that protects an optical semiconductor device such as an LED, a diversion diode, an LSI, or an organic EL. Although a curing temperature of the optical semiconductor sealing curable composition is not restricted in particular, it is usually 20 to 250° C. or preferably 40 to 200° C. Moreover, as a curing time in this case, although a time that a cross-linking reaction or an adhesive response with respect to various semiconductor package materials is finished can be appropriately selected, the curing time is generally preferably 10 minutes to 10 hours, and it is more preferably 30 minutes to 8 hours.

Further, as a transmittance for linear light of 450 nm in a cured material obtained by curing the composition according to the present invention into a sheet form having a thickness of 2 mm, 80% or above is preferable, and 85% or above is more preferable. When the transmittance is 80% or above, light taking-out efficiency of the optical semiconductor apparatus in which the optical semiconductor device is sealed by the cured material obtained curing the composition according to the present invention is not lowered, which is preferable.

Furthermore, it is preferable for a refractive index of the cured material obtained by curing the composition according to the present invention at 25° C. and 589 nm (a D line of sodium) to be 1.30 to 1.39. When the refractive index falls within this rage, the light taking-out efficiency of the optical semiconductor apparatus having the optical semiconductor device sealed by the cured material obtained by curing the composition according to the present invention is not lowered by design of the optical semiconductor apparatus, which is preferable.

It is to be noted that, when using the composition according to the present invention, the composition may be dissolved with desired concentration to an appropriate fluorinated solvent, e.g., 1,3-bis(trifluoromethyl)benzene, Fluorinert (manufactured by 3M), perfluorobutylmethylether, or perfluorobutylethylether and then used.

The optical semiconductor apparatus that can use the optical semiconductor sealing curable composition according to the present invention is not restricted in particular, and a known optical semiconductor apparatus may be adopted. The optical semiconductor apparatus according to the present invention has the optical semiconductor device and the cured material obtained by curing the optical semiconductor sealing curable composition according to the present invention configured to seal the optical semiconductor device, and FIG. 1 and FIG. 2 show a typical cross-sectional configuration.

Figure 2:
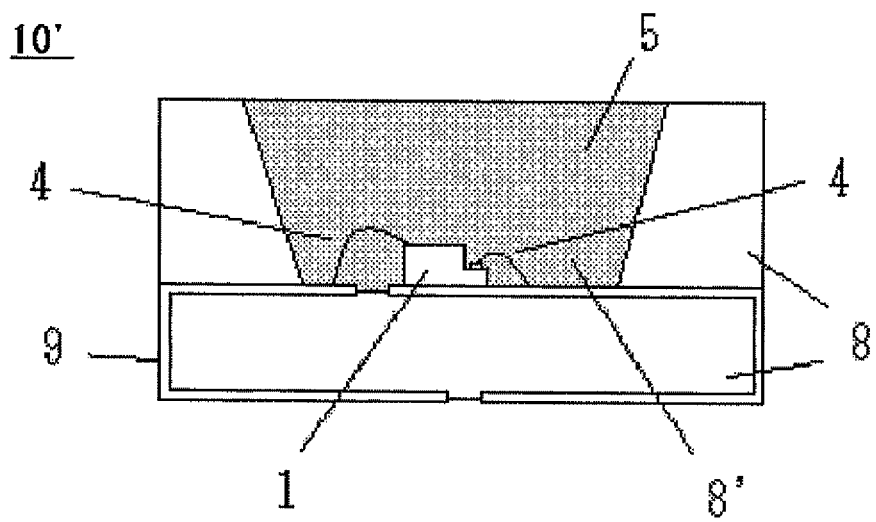
FIG. 2 is a schematic cross-sectional view showing another example of the optical semiconductor apparatus according to the present invention.

In an optical semiconductor apparatus (a light-emitting apparatus) 10 shown in FIG. 1, a mortar-shaped concave portion 2' whose bore diameter gradually increases from a bottom surface toward the upper side is provided at a distal end portion 2a of a first lead frame 2, an LED chip 1 is connected to and fixed on the bottom surface of the concave portion 2' through a silver paste or the like by die bonding, whereby the first lead frame 2 is electrically connected to one electrode (not shown) on a bottom surface of the LED chip 1. Moreover, a distal end portion 3a of a second lead frame 3 is electrically connected to the other electrode (not shown) on an upper surface of the LED chip 1 through a bonding wire 4.

Additionally, in the concave portion 2', the LED chip 1 is coated with a sealing member 5.

Further, the LED chip 1, the distal end portion 2a and an upper end of a terminal portion 2b of the first lead frame 2 and the distal end portion 3a and an upper end of a terminal portion 3b of the second lead frame 3 are coated with/sealed by a translucent resin portion 7 having a convex lens portion 6 at a distal end thereof. Furthermore, a lower end of the terminal portion 2b of the first lead frame 2 and a lower end of the terminal portion 3b of the second lead frame 3 are protruded toward the outside through a lower end portion of the translucent resin portion 7.

In an optical semiconductor apparatus (a light-emitting apparatus) 10' in FIG. 2, a mortar-shaped concave portion 8' whose bore diameter gradually increases from a bottom surface toward the upper side is provided in an upper portion of a package substrate 8, an LED chip 1 is bonded to and fixed on a bottom surface of the concave portion 8' by using a die bonding material, and an electrode of the LED chip 1 is electrically connected to an electrode 9 provided to the package substrate 8 through a bonding wire 4.

Moreover, in the concave portion 8', the LED chip 1 is coated with a sealing member 5.

Here, the LED chip 1 is not restricted in particular, and a light-emitting device which is used for a conventionally known LED chip can be adopted. As such a light-emitting device, there is one fabricated by laminating a semiconductor material on a substrate having a buffer layer of GaN or AlN provided thereon as required by various methods such as an MOCVD method, an HDVPE method, or a liquid phase growth method. As the substrate in this case, various materials can be used, and there are, e.g., sapphire, spinel, SiC, Si, ZnO, GaN single crystal, and others. In these materials, using sapphire is preferable since GaN having excellent crystallinity can be easily formed and an industrial utility value is high.

As the semiconductor material to be laminated, there are, e.g., GaAs, GaP, GaAlAs, GaAsP, AlGaInP, GaN, InN, AlN, InGaN, InGaAlN, SiC, and others. Of these materials, in terms of the fact that high luminance can be obtained, a nitride based compound semiconductor ($In_xGa_yAl_zN$) is preferable. Such a material may contain an activator and the like.

As the configuration of the light-emitting device, there are, e.g., MIS junction, pn junction, homo junction having PIN junction, hetero junction, double hetero junction, and others. Further, a single or multiple quantum well structure can be adopted.

A passivation layer may be or may not be provided to the light-emitting device.

Although various kinds of emission wavelength from an ultraviolet region to an infrared region can be used, the effect of the present invention is considerable when the light-emitting device having a main emission peak wavelength that is not greater than 550 is used.

One type of light-emitting device 1 may be used to effect single-color emission, or a plurality of types of light-emitting device 1 may be used to effect multicolor emission.

An electrode can be formed to the light-emitting device by a conventionally known method.

The electrode on the light-emitting device can be electrically connected to a lead terminal by various methods. As an electrical connection member, a member having, e.g., excellent ohmic mechanical connection properties with respect to the electrode of the light-emitting device is preferable and, for example, there is such a bonding wire 4 using gold, silver, copper, platinum, aluminum, or an alloy of these materials as depicted in FIG. 1 or FIG. 2. Moreover, it is possible to use, e.g., a conductive adhesive having a conductive filler such as silver or carbon filled with a resin. Of these materials, using an aluminum wire or a gold wire is preferable in terms of excellent operability.

It is to be noted the first lead frame 2 and the second lead frame 3 are made of copper, a copper-zinc alloy, a nickel-iron alloy, or the like.

Additionally, as a material making the translucent resin portion 7, a material having translucency is not restricted in particular, but an epoxy resin or a silicone resin is mainly used.

Further, the package substrate 8 can be fabricated using various kinds of materials and, there are, e.g., polyphthalate amide (PPA), a polycarbonate resin, a polyphenylene sulfide resin, a polybutylene terephthalate resin, a polyamide resin, a liquid crystal polymer, an epoxy resin, an acrylic resin, a silicone resin, a modified silicone resin, an ABS resin, a BT resin, ceramic, and others. Of these materials, in terms of heat resistance, strength, and a cost, polyphthalate amide (PPA) is preferable. Furthermore, for the package substrate 8, it is preferable to mix a white pigment such as barium titanate, titanium oxide, zinc oxide, or barium sulfate and thereby improve light reflectance.

Then, the sealing member 5 coating the LED chip 1 allows light from the LED chip 1 to be efficiently transmitted therethrough toward the outside and also protects the LED chip 1 or the bonding wire 4 from external force or dust. As the sealing member 5, the composition according to the present invention is used. The sealing member 5 may contain a fluorescent material or a light diffusion member.

In the optical semiconductor sealing curable composition according to the present invention, since the cured material has excellent transparency, the optical semiconductor apparatus 10 or 10' according to the present invention having the optical semiconductor device sealed by using the composition has excellent light taking-out efficiency.

EXAMPLES

Although the present invention will now be specifically explained hereinafter by using examples and comparative examples, the present invention is not restricted to the following examples. It is to be noted that a part in the following examples represents a part by mass, and Me represents a methyl group. Further, viscosity represents a measured value at 23° C. (conforming to JIS K6249).

Example 1

7.6 parts of cyclic organopolysiloxane (an amount of SiH group: 0.00394 mole/g) represented by the following formula (17), 2.0 parts of cyclic organopolysiloxane represented by the following formula (18), 0.50 part of cyclic organopolysiloxane represented by the following formula (19), and 0.05 part of a toluene solution (concentration of platinum: 0.5 mass %) of a platinum-divinyltetramethyldisiloxane complex were sequentially added to 100 parts of a polymer (viscosity: 4010 mPa·s, an amount of a vinyl group: 0.030 mole/100 g) represented by the following formula (16), and these materials are uniformly mixed. Then, a degassing operation is performed to prepare a composition.

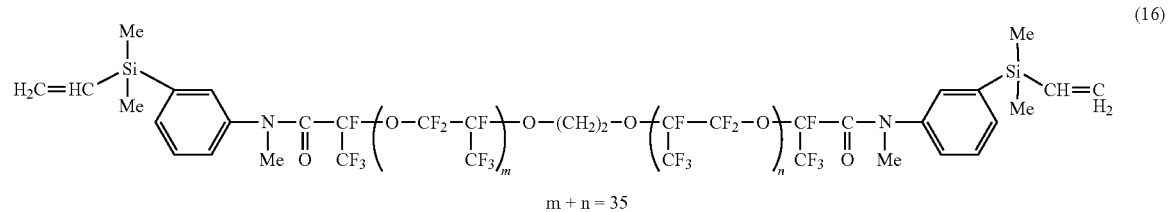
(16)
m + n = 35
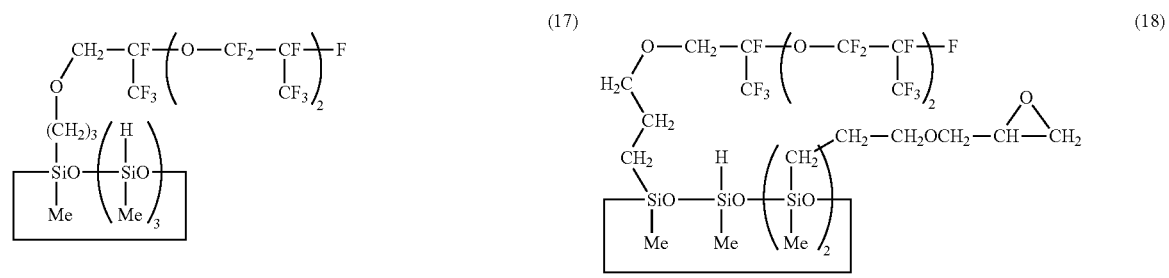
(17)
(18)
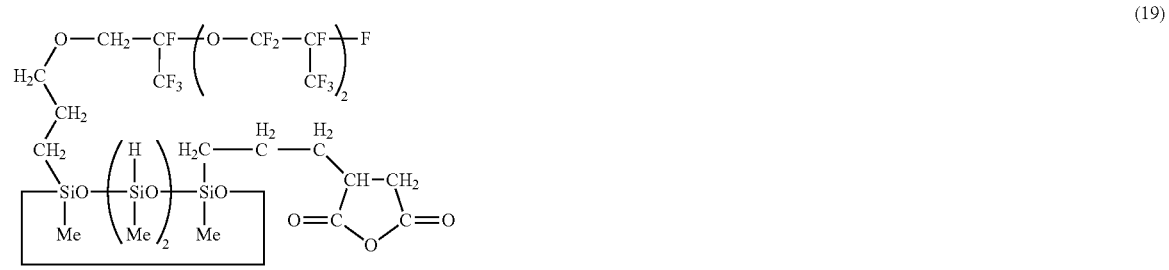
(19)

Example 2

In Example 1, a composition was prepared like Example 1 except that 6.0 parts of cyclic organopolysiloxane represented by the following formula (20) were added in place of cyclic organopolysiloxane represented by formula (17).

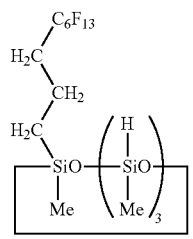
(20)

Example 3

In Example 1, a composition was prepared like Example 1 except that 4.0 parts of cyclic organopolysiloxane represented by the following formula (21) were added in place of cyclic organopolysiloxane represented by the above formula (18).

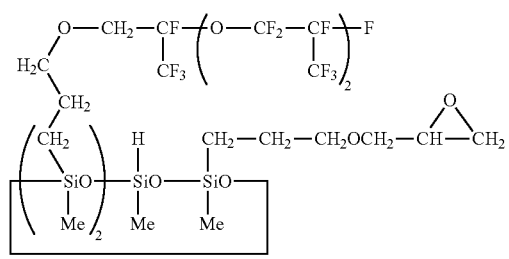
(21)

Example 4

In Example 1, a composition was prepared like Example 1 except that 3.0 parts of cyclic organopolysiloxane represented by the following formula (22) were added in place of cyclic organopolysiloxane represented by the above formula (18).

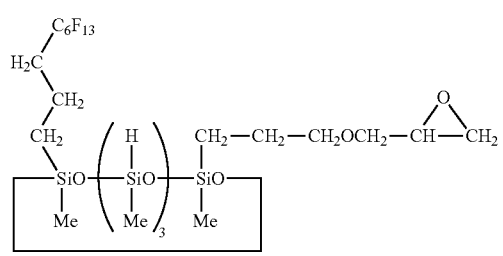
(22)

Example 5

In Example 1, a composition was prepared like Example 1 except that 4.0 parts of cyclic organopolysiloxane represented by the following formula (23) were added in place of cyclic organopolysiloxane the above formula (18).

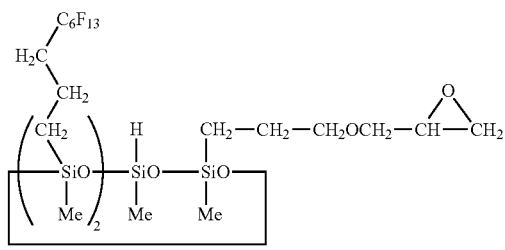
(23)

Example 6

In Example 1, a composition was prepared like Example 1 except that 0.05 part of cyclic organopolysiloxane represented by the following formula (24) was added in place of cyclic organopolysiloxane represented by the above formula (19).

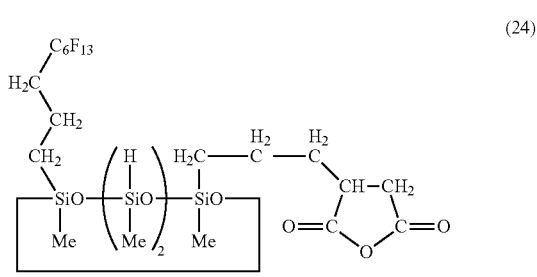
(24)

Comparative Example 1

In Example 1, a composition was prepared like Example 1 except that 4.1 parts of linear organopolysiloxane (an amount of an SiH group: 0.00727 mole/g) represented by the following formula (25) were added in place of cyclic organopolysiloxane represented by the above formula (17).

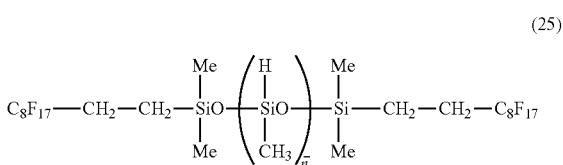
(25)

$\bar{n} = 15$

Comparative Example 2

In Example 1, a composition was prepared like Example 1 except that 5.0 parts of linear organopolysiloxane represented by the following formula (26) were added in place of cyclic organopolysiloxane represented by the above formula (18).

(26)

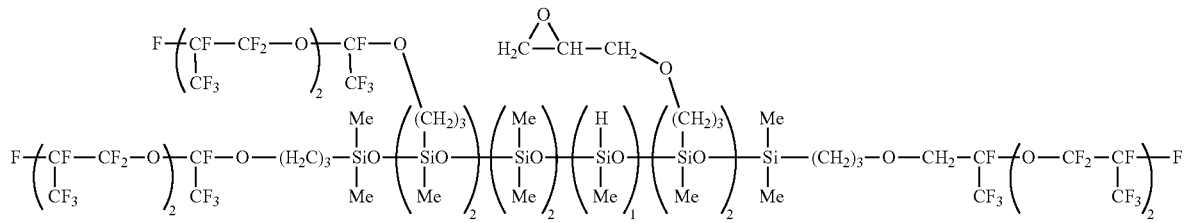

Comparative Example 3

In Example 1, a composition was prepared like Example 1 except that 2.0 parts of linear organopolysiloxane represented by the following formula (27) were added in place of cyclic organopolysiloxane represented by the above formula (19). 589 nm (a D line of sodium) at 25° C. was measured by a multiwavelength Abbe refractometer DR-M 2/1550 manufactured by Atago Co., Ltd.

4. Adhesiveness for polyphthalic amide (PPA): two test panels of PPA having a size of 100 mm×25 mm were laminated to sandwich a layer of each prepared composition having the thickness of 80 μm so that respective terminals can for linear light of 450 nm was measured by using a 0-3310 type spectrophotometer manufactured by Hitachi, Ltd.

3. Refractive index: a sheet-like cured material having a thickness of 2 mm was fabricated, and a refractive index for overlap 10 mm, and they are heated at 150° C. for 5 hours to cure the composition, thereby fabricating a bonded test piece. Then, a tensile shear bond test (a pulling rate: 50 mm/minute) was performed with respect to this test piece, and adhesion strength (shear bonding force) and a cohesive failure ratio were evaluated.

5. Luminosity of the optical semiconductor apparatus: in the optical semiconductor apparatus having the same configuration as that of the embodiment shown in FIG. 2, each composition obtained to form the sealing member 5 was put into the concave portion 8' so that the LED chip 1

(27)

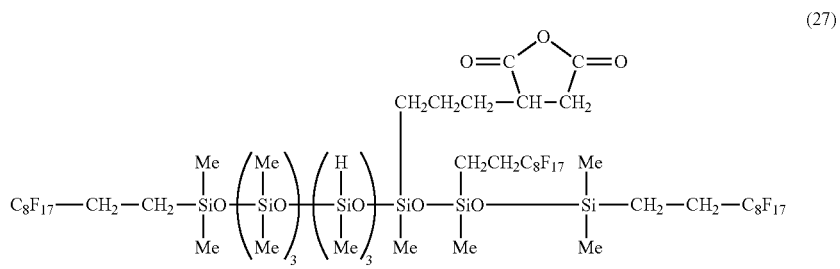

In regard to each composition, the following items were evaluated. It is to be noted that a curing condition is 150° C.×5 hours. Table 1 shows a result.

1. Appearance: a sheet-like cured material having a thickness of 2 mm was fabricated, and its appearance was visually observed.
2. Light transmittance: a sheet-like cured material having a thickness of 2 mm was fabricated, and a transmittance (%)

capable of emitting blue light (450 nm) can be immersed, and heating was performed at 150° C. for 5 hours, whereby the optical semiconductor apparatus having the LED chip 1 sealed with the cured material of each composition was fabricated. Further, the optical semiconductor apparatus was lighted based on the rating, and the luminosity was measured. A result is represented in the form of a relative value when the luminosity in Example 1 is determined as 1.00.

TABLE 1

|  | Example 1 | Example 2 | Example 3 | Example 4 | Example 5 | Example 6 |
|---|---|---|---|---|---|---|
| Appearance | Clear and colorless | Clear and colorless | Clear and colorless | Clear and colorless | Clear and colorless | Clear and colorless |
| Light transmittance/% | 90 | 90 | 92 | 88 | 92 | 88 |
| Refractive index | 1.34 | 1.34 | 1.34 | 1.34 | 1.34 | 1.34 |
| PPA shear bond force/MPa | 0.5 | 0.5 | 0.4 | 0.6 | 0.5 | 0.6 |
| PPA Cohesive failure ratio/% | 100 | 100 | 100 | 100 | 100 | 100 |
| Relative luminosity | 1.00 | 1.00 | 1.03 | 0.98 | 1.03 | 0.98 |

|  | Comparative Example 1 | Comparative Example 2 | Comparative Example 3 |
|---|---|---|---|
| Appearance | Slightly turbid | Slightly turbid | Slightly turbid |
| Light transmittance/% | 79 | 72 | 73 |
| Refractive index | 1.34 | 1.34 | 1.34 |
| PPA shear bond force/MPa | 0.8 | 0.4 | 0.4 |
| PPA cohesive failure ratio/% | 100 | 100 | 100 |
| Relative luminosity | 0.87 | 0.75 | 0.76 |

Based on the result shown in Table 1, it was revealed that the cured material obtained by curing the optical semiconductor sealing curable composition (Examples 1 to 6) according to the present invention containing all of the components (A) to (E) has excellent transparency as compared with Comparative Examples 1 to 3, and hence the optical semiconductor apparatus having the optical semiconductor device sealed therein has the excellent light taking-out efficiency.

It is to be noted that the present invention is not restricted to the foregoing embodiment. The foregoing embodiment is just an illustration, and any examples that have substantially the same configuration and exercise the same operations and effects as the technical concept described in claims of the present invention are included in the technical scope of the present invention.

What is claimed is:

1. An optical semiconductor sealing curable composition, wherein the optical semiconductor sealing curable composition contains:

(A) 100 parts by mass of a linear polyfluoro compound represented by the following general formula (1), $$CH_2=CH-(X)_a-Rf^1-(X')_a-CH=CH_2 \quad (1)$$

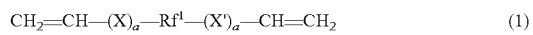

wherein X represents a group represented by any one of $-CH_2-$, $-CH_2O-$, $-CH_2OCH_2-$, and $-Y-NR^1-CO-$ (Y represents $-CH_2-$ or an o, m, or p-dimethylsilylphenylene group represented by the following structural formula (2),

and $R^1$ represents a hydrogen atom or an unsubstituted or substituted monovalent hydrocarbon group), X' represents a group represented by any one of $-CH_2-$, $-OCH_2-$, $-CH_2OCH_2-$, and $-CO-NR^1-Y'-$ (Y' represents $-CH_2-$ or an o, m, or p-dimethylsilylphenylene group represented by the following structural formula (3), and $R^1$ represents the same group as above, and

a represents independently 0 or 1, $Rf^1$ represents a divalent perfluoropolyether group represented by the following general formula (4) or (5),

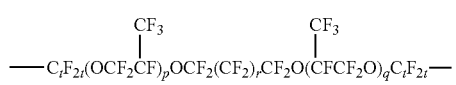

(4)

wherein each of p and q represents an integer of 1 to 150, and an average of sums of p and q is 2 to 300, further, r represents an integer of 0 to 6, and t represents 2 or 3,

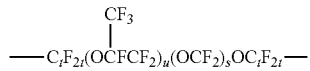

(5)

wherein u represents an integer of 1 to 300, s represents an integer of 1 to 80, and t represents the same as above;

(B) cyclic organopolysiloxane which is represented by the following general formula (6) and has a hydrogen atom directly bonded to a silicon atom and a monovalent perfluoroalkyl group or a monovalent perfluorooxyalkyl group bonded to the silicon atom through a divalent hydrocarbon group which is allowed to contain an oxygen atom or a nitrogen atom per molecule, and whose amount allows the hydrogen atom directly bonded to the silicon atom to be 0.5 to 2.0 mole with respect to 1 mole of the alkenyl group in the component (A),

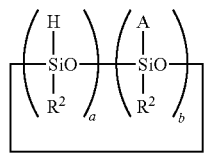

(6)

wherein a represents an integer of 3 to 6, b represents an integer of 1 to 4, a+b represents an integer of 4 to 10, $R^2$ represents a substituted or unsubstituted monovalent hydrocarbon group, and A represents a monovalent perfluoroalkyl group or a monovalent perfluorooxyalkyl group bonded to a silicon atom through a divalent hydrocarbon group that is allowed to contain an oxygen atom or a nitrogen atom;

(C) 0.1 to 500 ppm of a platinum group metal catalyst when converted into a platinum group metal atom;

(D) 0.1 to 10.0 parts by mass of cyclic organopolysiloxane which is represented by the following general formula (7) and has a hydrogen atom directly bonded to a silicon atom, a monovalent perfluoroalkyl group or a monovalent perfluorooxyalkyl group bonded to a silicon atom through a divalent hydrocarbon group that is allowed to contain an oxygen atom or a nitrogen atom, and an epoxy group bonded to a silicon atom through a divalent hydrocarbon group that is allowed to contain an oxygen atom per molecule,

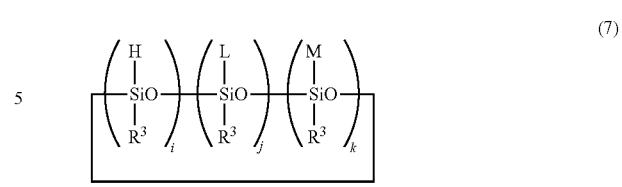

(7)

wherein i represents an integer of 1 to 6, j represents an integer of 1 to 4, k represents an integer of 1 to 4, i+j+k represents an integer of 4 to 10, $R^3$ represents a substituted or unsubstituted monovalent hydrocarbon group, L represents a monovalent perfluoroalkyl group or a monovalent perfluorooxyalkyl group bonded to a silicon atom through a divalent hydrocarbon group that is allowed to contain an oxygen atom or a nitrogen atom, and M represents an epoxy group bonded to a silicon atom through a divalent hydrocarbon group that is allowed to contain an oxygen atom; and (E) 0.01 to 5.0 parts by mass of cyclic organopolysiloxane which is represented by the following general formula (8) and has a hydrogen atom directly bonded to a silicon atom, a monovalent perfluoroalkyl group or a monovalent perfluorooxyalkyl group bonded to a silicon atom through a divalent hydrocarbon group that is allowed to contain an oxygen atom or a nitrogen atom, and a cyclic carboxylic acid anhydride residue bonded to a silicon atom through a divalent hydrocarbon group per molecule,

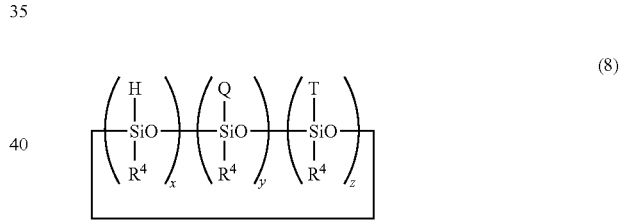

(8)

wherein x represents an integer of 1 to 6, y represents an integer of 1 to 4, z represents an integer of 1 to 4, x+y+z represents an integer of 4 to 10, $R^4$ represents a substituted or unsubstituted monovalent hydrocarbon group, Q represents a monovalent perfluoroalkyl group or a monovalent perfluorooxyalkyl group bonded to a silicon atom through a divalent hydrocarbon group that is allowed to contain an oxygen atom or a nitrogen atom, and T is a cyclic carboxylic acid anhydride residue bonded to a silicon atom through a divalent hydrocarbon group, wherein the monovalent perfluoroalkyl group or the monovalent perfluorooxyalkyl group included in each cyclic organopolysiloxane in the component (B), the component (D), and the component (E) is represented by the following general formula (9) or general formula (10), $C_fF_{2f+1}-$  (9)

wherein f represents an integer of 1 to 10,

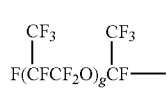 (10)

wherein g represents an integer of 1 to 10, and wherein a transmittance for linear light having a wavelength of 450 nm in a cured material having a thickness of 2 mm after curing is not lower than 80%, and a refractive index of the cured material after curing at 25° C. and 589 nm (a D line of sodium) is 1.30 to 1.39.

2. The optical semiconductor sealing curable composition according to claim 1, wherein content of the alkenyl group in the linear polyfluoro compound in the component (A) is 0.005 to 0.100 mole/100 g.

3. An optical semiconductor apparatus comprising: an optical semiconductor device; and a cured material which is obtained by curing the optical semiconductor sealing curable composition according to claim 1 configured to seal the optical semiconductor device.

4. The optical semiconductor apparatus according to claim 3, wherein the optical semiconductor device is a light-emitting diode.

* * * * *